(12) United States Patent
Abe

(10) Patent No.: US 7,110,735 B2
(45) Date of Patent: Sep. 19, 2006

(54) AUTOMATIC GAIN CONTROL SYSTEM

(75) Inventor: Yoshinori Abe, Tokyo-to (JP)

(73) Assignee: Pioneer Corporation, Tokyo-to (JP)

( * ) Notice: Subject to any disclaimer, the term of this patent is extended or adjusted under 35 U.S.C. 154(b) by 413 days.

(21) Appl. No.: 10/689,664

(22) Filed: Oct. 22, 2003

(65) Prior Publication Data

US 2004/0087287 A1    May 6, 2004

(30) Foreign Application Priority Data

Oct. 23, 2002  (JP) .......................... P2002-308410

(51) Int. Cl.
*H04B 1/06* (2006.01)
*H04B 7/00* (2006.01)

(52) U.S. Cl. .............. 455/234.1; 455/249.1; 455/253.2; 375/345

(58) Field of Classification Search ............ 455/231.1, 455/234.1, 234.2, 235.1, 240.1, 249.1, 250.1, 455/253.2; 375/345
See application file for complete search history.

(56) References Cited

U.S. PATENT DOCUMENTS 6,628,932 B1 *  9/2003  Myers ...................... 455/234.1
6,785,523 B1 *  8/2004  Husted et al. ........... 455/234.1

FOREIGN PATENT DOCUMENTS

JP       10-65750        3/1998

\* cited by examiner

*Primary Examiner*—Quochien B. Vuong
(74) *Attorney, Agent, or Firm*—Nixon & Vanderhye, PC

(57) ABSTRACT

An example automatic gain control (AGC) system in which an adder adds a radio frequency (RF) signal power of only the low-frequency component of an RF signal and an intermediate-frequency (IF) signal of an output from a variable-gain intermediate-frequency amplifier, which is higher than the frequency of the low-frequency component, and outputs the result to an A/D converter. This construction makes it possible to input power data for the RF stage to a demodulation LSI. The demodulation LSI separates the low-frequency component from the input signal, and by detecting the power of the extracted signal, is able to obtain the output data for the RF signal, and it separates the IF component from the input signal, and by detecting the power of the extracted signal, is able to obtain the output data for the IF signal.

3 Claims, 2 Drawing Sheets

AUTOMATIC GAIN CONTROL SYSTEM

BACKGROUND OF THE INVENTION

1. Field of the Invention

This invention relates to Automatic Gain Control (AGC) used in communication apparatuses, recording/reproduction apparatuses, and other signal-processing apparatuses.

2. Description of the Related Art

As a related art, a prior AGC system described in Japanese Patent Laid-Open No. H10-65750 has been known.

FIG. 1 shows a first example of a prior delay AGC system. The input RF (Radio frequency) is supplied to and amplified by a variable-gain RF amplifier 13. Here, in order to simplify the explanation, the variable-gain RF amplifier 13 comprises a variable attenuator 131 and fixed-gain RF amplifier 132. The output signal of the variable-gain RF amplifier 13 is multiplied with the output sine wave from a local oscillator 14 by a mixer 15 and then converted to an IF (intermediate frequency) signal. The IF signal output from the mixer is band-limited by a SAW (surface acoustic wave) filter 16 to only a signal in a desired channel. In other words, the SAW filter 16 removes signals such as the adjacent channel signals. Here, in order to simplify the explanation, the total power gain of the fixed-gain RF amplifier 132, mixer 15 and SAW filter 16 for the desired channel is taken to be unity. The output IF signal from the SAW filter is supplied to and amplified by a variable-gain IF amplifier 17, and then is digitized by an A/D converter 18 and input to a demodulation LSI 19. The demodulation LSI 19 demodulates the input IF signal by appropriate signal processing, and together with decoding the transmission-data sequence, it performs AGC of the gain Gatt of the variable attenuator 131 and the gain Gif of the variable-gain IF amplifier such that the IF signal input to the A/D converter is at a suitable power Pref. AGC is performed as follows. First, with the gains Gatt and Gif set to proper values, the power Pif of the IF signal input to the A/D converter is calculated. The passband power Pin of the input signal of the system, or the RF signal input to the variable attenuator 131, can be calculated from Pif as shown below.

$$Pin = Pif/(Gif \times Gatt) \quad \text{[Equation 1]}$$

Control of the gains Gif and Gatt is performed using the equation below based on the calculated Pin.

$$Pin < Pt: Gatt = 1, Gif = Pref/Pin \quad \text{[Equation 2]}$$

$$Pin \geq Pt: Gatt = Pt/Pin, Gif = Pref/Pt \quad \text{[Equation 3]}$$

That is, when Pin is less than a constant power Pt, it is possible to minimize the noise factor by maximizing the gain Gatt, and when Pin is greater than Pt, it is possible to suppress distortion in the RF stage by limiting the passing bandwidth power of the input to the fixed-gain RF amplifier 132 to Pt.

However, in the method described above, even though it may be possible to limit the power for desired channel in the RF stage, it is not possible to limit the total power for that entire bandwidth. Therefore, when the power of a signal not in the desired channel is large, there is an inconvenience in that the signal in the RF stage becomes distorted.

In order to solve this inconvenience, a method has been proposed in which a dedicated power detector is placed in the RF stage, and is used to independently control the RF gain. This is shown in FIG. 2.

In FIG. 2 there is a power detector 25 for detecting the power of the variable-gain RF amplifier. A rectifying circuit having a diode and capacitor can be used for this power detector 25. The output from the power detector 25 is averaged by a low-pass filter 26 in order to reduce the effects of noise and short-term power fluctuations. The average power value, which is the output from the low-pass filter 26, is input to a comparator 29. The other input to the comparator 29 is set to a reference power value (REFERENCE), which will be used as a comparison. In other words, when the average power value that is input is greater than the reference power value, the gain of the variable-gain RF amplifier 20 becomes smaller according to the output from the comparator 29, and when the average power value that is input is less than the reference power value, the gain of the variable-gain RF amplifier 20 becomes larger according to the output from the comparator 29. That is, the gain of the variable-gain RF amplifier 20 is controlled such that the average power value is equal to the reference power value.

On the other hand, a demodulation LSI 28 controls the gain of the variable-gain IF amplifier 24 such that the input power to the A/D converter 27 is a proper value.

By independently performing AGC for the RF stage and IF stage, it is possible to avoid the inconvenience of delayed AGC as shown in FIG. 1 of the signal becoming distorted in the RF stage when the power of the signal not in the desired channel is large.

However, in the case shown in FIG. 2, control of the RF gain and the IF gain is performed independently, so an inconvenience occurs that total AGC for the overall system cannot be performed.

Also, since it is not possible to control the gain directly in the RF stage from the demodulation LSI, an inconvenience occurs that it is not possible to perform adaptive control of the control speed of the RF gain control. In order to solve these inconveniences, it is necessary to input the detected power information for both the RF stage and IF stage input to the demodulation LSI, and to control both the RF gain and IF gain uniformly from the demodulation LSI based on the information.

In these prior AGC systems, data related to the total power of RF stage was not input to the demodulation LSI, so there was an inconvenience in that it was difficult to perform adjustment and adaptive control for the AGC as an overall system.

SUMMARY OF THE INVENTION

The object of this invention is to provide an AGC system that is capable of performing uniform RF (radio-frequency) gain control without increasing the amount of hardware needed in comparison to prior AGC systems, and by doing so is capable of easily performing adaptive control for balancing the RF gain and IF (intermediate-frequency) gain and changing or performing adaptive control of the gain control speed.

The above object of the present invention can be achieved by an AGC system of the present invention. The AGC system, is provided with an RF amplifier; a local oscillator; a mixing unit that combines the output signal from the RF amplifier and the output signal from the local oscillator and generates an IF signal; a bandpass filter that limits the bandwidth of the IF signal; an IF amplifier that amplifies the output signal from the bandpass filter; a power detector that detects the power of the output signal from the RF amplifier; a filtering unit that filters the output signal from the power detector; an adder that adds the output signal from the filtering unit and the output signal from the IF amplifier; an A/D converter that converts the output signal from the adder from analog to digital; and a controller that adjusts the gain of the RF amplifier and gain of the IF amplifier based on the output signal from the A/D converter.

In one aspect of the present invention, the AGC system is provided with an RF amplifier; a local oscillator; a mixing unit that combines the output signal from the RF amplifier and the output signal from the local oscillator and generates an IF signal; a bandpass filter that limits the bandwidth of the IF signal; an IF amplifier that amplifies the output signal from the bandpass filter; a first A/D converter that converts the output signal from the bandpass filter from analog to digital; a power detector that detects the power of the output signal from the RF amplifier; a filtering unit that filters the output signal from the power detector; a second A/D converter that converts the output signal from the filtering unit from analog to digital; and a controller to which both the output signal from the first A/D converter and the output signal from the second A/D converter are input, wherein the controller adjusts the gain of the RF amplifier and the gain of the IF amplifier based on the output signal from the first A/D converter and the output signal from the second A/D converter.

In another aspect of the present invention, the controller of the AGC system calculates both the power of the RF signal that is input to the RF amplifier and the power of the IF signal that is input to the IF amplifier, whose bandwidth is limited, based on the gain of the RF amplifier and the gain of the IF amplifier, and adjusts the gain of the RF amplifier and the gain of the IF amplifier based on the calculated powers.

In a further aspect of the present invention, the controller of the AGC system calculates an error rate for the data outputted from the A/D converter, and adjusts the gain of said RF amplifier and the gain of said IF amplifier based on the calculated error rate.

In a further aspect of the present invention, the controller of the AGC system calculates an error rate for the data outputted from the second A/D converter, and adjusts the gain of said RE amplifier and gain of said IF amplifier based on the calculated error rate.

DESCRIPTION OF THE PREFERRED EMBODIMENTS

Embodiment 1

A first embodiment of the AGC system of this invention will be explained below.

Figure 1:
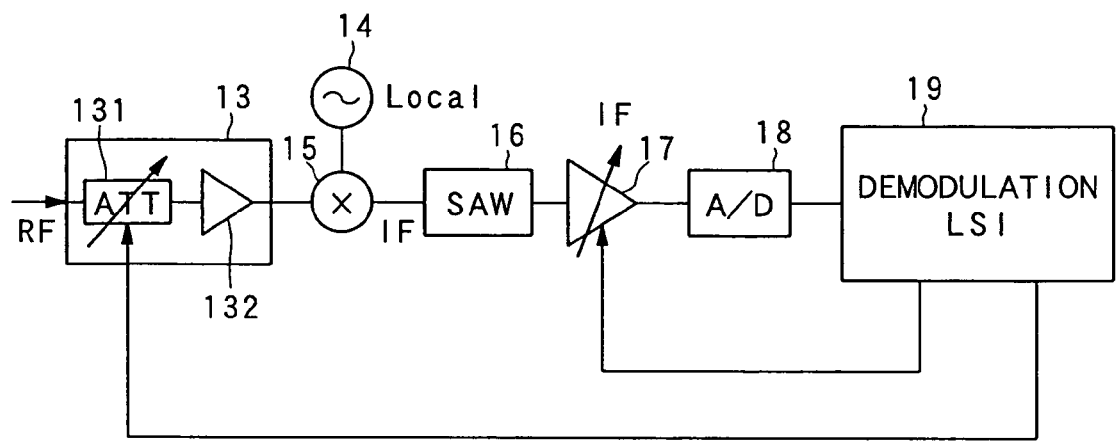
FIG. 1 is a block diagram of a prior delay AGC system.
Figure 2:
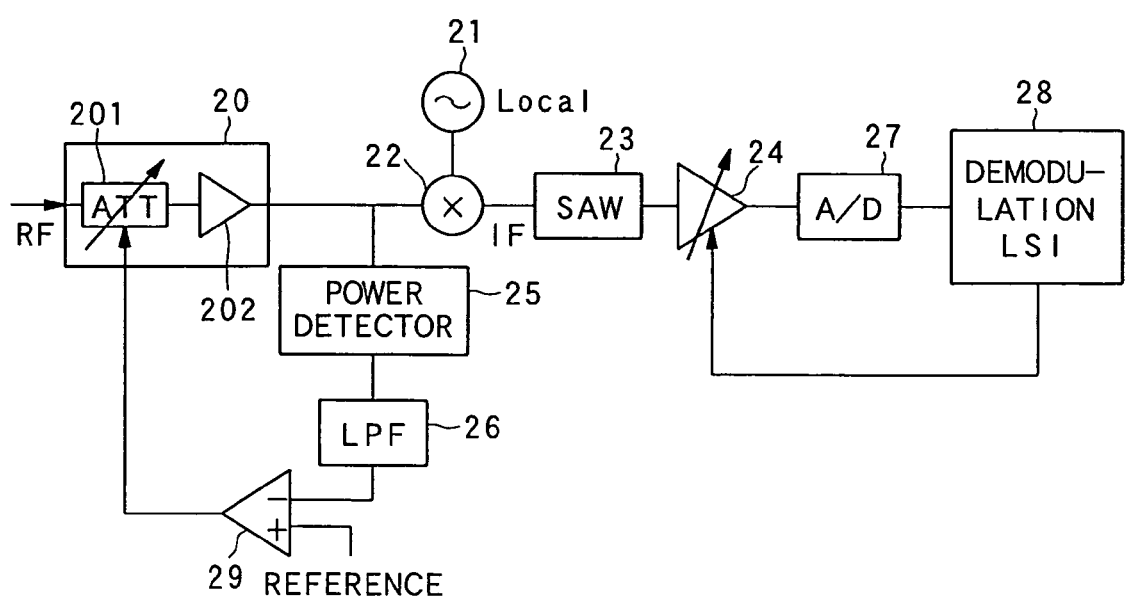
FIG. 2 is a block diagram of a prior AGC system.
Figure 3:
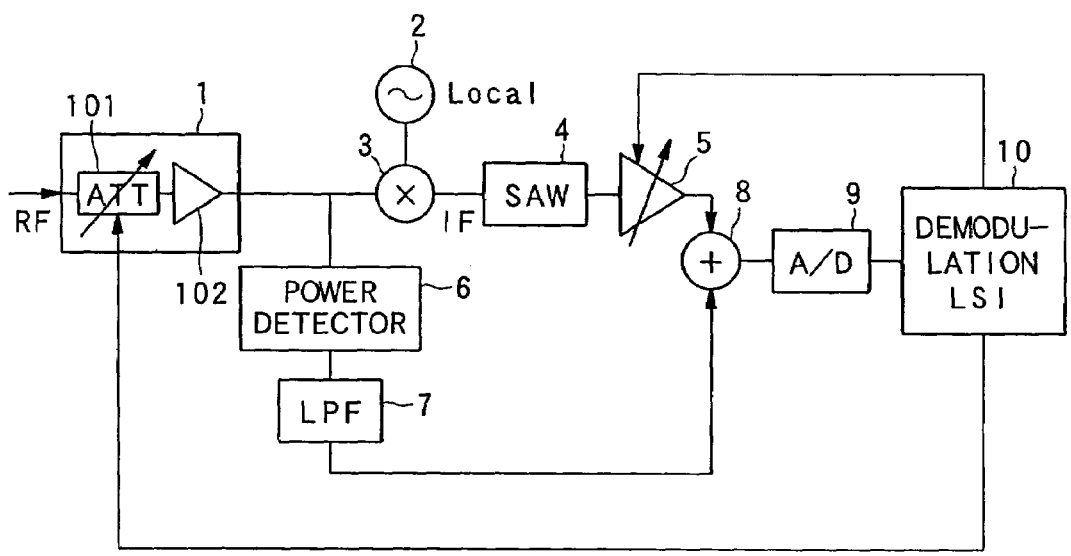
FIG. 3 is a block diagram of the construction of the AGC system of a first embodiment of the invention.

FIG. 3 is a block diagram showing this first embodiment of the AGC system of this invention.

The AGC system of this embodiment comprises: a variable-gain RF amplifier 1, local oscillator 2, mixing unit 3, SAW filter 4 for limiting the bandwidth, variable-gain IF amplifier 5 that amplifies the output signal from the SAW filter 4, power detector 6 that detects the power of the output signal from the RF amplifier 1, low-pass filter (LPF) 7, adder 8, A/D converter 9 and demodulation LSI 10. The variable-gain RF amplifier 1 comprises: a variable attenuator 101 whose attenuation is set by the demodulation LSI 10, and a fixed-gain RF amplifier 102 having a specific gain, and where the gain of the variable-gain RF amplifier 1 is a combined value of the attenuation of the variable attenuator 101 and the gain of the fixed-gain RF amplifier 101.

The received RE signal that is received by the receiving antenna is supplied to the variable-gain RE amplifier 1 via the tuner-input terminal, and is amplified by the variable-gain RF amplifier 1. The mixing unit 3 mixes the amplified received signal with the oscillation signal from the local oscillator 2, and this mixed signal is input to the SAW filter 4 that limits the bandwidth. Here, only an IF signal that matches the IF is extracted, and input to the variable-gain IF amplifier 5. On the other hand, the output signal from the variable-gain RF amplifier 1 is also input to the power detector 6. The power detector 6 detects the power of output signal from the variable-gain RF amplifier 1. The output signal of the power detector 6 is sent to the low-pass filter 7. The low-pass filter 7 extracts the low-frequency component of the output signal from the power detector 6 and sends it to the adder 8. The adder 8 adds the detected power of the RE signal of just the low-frequency component with that of the IE signal output from the variable-gain IE amplifier, which has a higher frequency than the aforementioned low-frequency component, and outputs the result to the A/D converter 9. In other words, the output from the dedicated power detector 3 located in the RF stage is added to the IF signal, then A/D conversion of the added signal is performed. With this kind of configuration, it is possible to input the power information for the RF stage to the demodulation LSI 10. The demodulation LSI 10 separates out the low-frequency component from the input signal, and by detecting the power of this extracted signal, it is possible to obtain the power information for the RF signal, and by separating out the IF component from the input signal and detecting the power of this extracted signal, it is possible to obtain the output information for the IF signal.

In the demodulation LSI 10, it is possible to uniformly control both the gain (RF gain) of the variable-gain RF amplifier 1 and the gain (IF gain) of the variable-gain IF amplifier 5 based on the power data obtained for both the RF stage and IF stage. Here, the demodulation LSI 10 corresponds to the control unit that adjusts the gain of the RF amplifier and the gain of the IF amplifier.

As a detailed example of the control method, the power of the input signal to the RF stage is calculated based on the output power of the RF stage detected by the power detector and the gain of the RF stage. The calculated power is supposed to include both the power of an input signal in the passband (desired signal power) and the power of an input signal outside of the passband (undesired signal power).

On the other hand, another output power of the RF stage is calculated based on the output power of the IF stage and the gain of the IF stage. Then, similarly, another power of the input signal to the RF stage is calculated. However, the later calculated power is supposed to include only the power of an input signal in the passband (desired signal power).

Then, the undesired signal power can be calculated by subtracting the later calculated power from the former calculated power.

Based on a function of the desired signal power and the undesired signal power, the RF gain and the IF gain are respectively controlled properly.

With this method, AGC that takes into consideration the power ratio of the desired signal and interference signal (undesired signal), or so-called D/U ratio, is possible, and thus it is possible to improve the performance over the prior methods. A method of performing control using a function of the input signals power to both the RF and IF stages without using the power of the interference signal (undesired signal) is also possible. Moreover, in regards to calculating the power of the input signals to both stages, characteristics such as the gain or loss in circuits in the signal path such as the mixing unit 3 or SAW filter 4 could also be used.

Also, since all AGC is performed from the demodulation LSI, AGC based on the SN ratio and/or data error rate observed in the demodulation LSI, or adaptive control of the AGC speed can be performed easily in the demodulation LSI.

With this embodiment of the invention, it is possible to input the information of the total power for the RF stage to the demodulation LSI without having to greatly increase the hardware in comparison to the prior art. This makes it possible to easily perform adaptive control of the RF/IF gain balance, as well as adaptive control of the RF gain control speed.

Embodiment 2

A second embodiment of the AGC system of this invention is explained below. An explanation of components that are the same as those of the first embodiment will be omitted.

Figure 4:
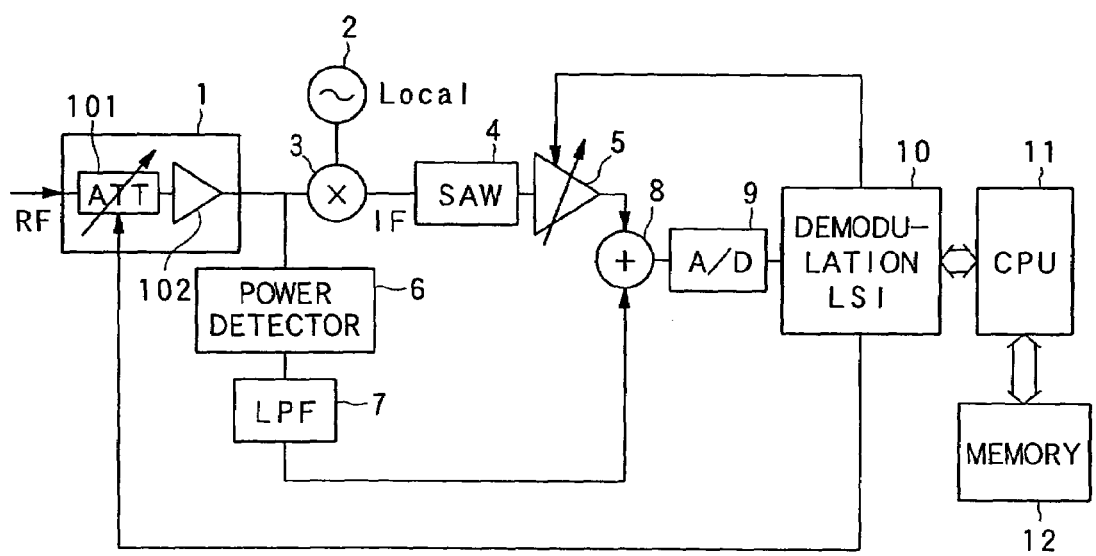
FIG. 4 is a block diagram of the construction of the AGC system of a second embodiment of the invention.

FIG. 4 is a block diagram showing the construction of the AGC system of this second embodiment.

The AGC system of this embodiment comprises: a variable-gain RF amplifier 1, local oscillator 2, mixing unit 3, SAW filter 4 that limits the bandwidth, variable-gain IF amplifier 5 that amplifies the output signal from the SAW filter 4, power detector 6 that detects the power from the RF amplifier 1, LPF 7, adder 8, A/D converter 9, demodulation LSI 10, CPU 11 and memory 12.

In this embodiment, the demodulation LSI 10 demodulates the IF signal, and obtains a digital signal of the data, then sends that signal to the CPU 11. The CPU 11 effectively uses the memory 12 and calculates the error rate for the data, and outputs a signal to the demodulation LSI 10 in order to independently change the gain of the variable-gain RF amplifier 1 and the gain of the variable-gain IF amplifier 5 such that the error rate of the signal is minimized. By minimizing the error rate of the data in this way, it is also possible to continuously adjust the gain. Moreover, it is also possible to perform demodulation of the data using the CPU 11.

With this embodiment, it is possible to independently perform gain control of the RF amplifier 1 from the demodulation LSI 10 without having to greatly increase the hardware in comparison with the prior art.

This makes it possible to easily perform adaptive control of the RF/IF gain balance as well as change the RF gain control speed and perform RF adaptive control.

Also, in the first embodiment and second embodiment, the signal obtained after the adder 8 adds the output signal from the variable-gain IF amplifier 5 and the output signal from the LPF 7 is converted to a digital signal in the A/D converter 9, however, the invention is not limited to this, and it is possible install a second A/D converter instead of an adder 8, and to convert the output signal from the LPF 7 to a digital signal by this second A/D converter and input the signal to the demodulation LSI 10. In this case, the output signals from two A/D converters are input in parallel to the demodulation LSI 10.

The AGC system of the first embodiment of the invention is provided with: a variable-gain RF amplifier 1, local oscillator 2, mixing unit 3, SAW filter 4 that limits the bandwidth, variable-gain IF amplifier 5 that amplifies the output signal from the SAW filter 4, power detector 6 that detects the power from the RF amplifier 1, LPF 7, adder 8, A/D converter 9 and demodulation LSI 10.

The AGC system of the second embodiment is provided with: a variable-gain RF amplifier 1, local oscillator 2, mixing unit 3, SAW filter 4 that limits the bandwidth, variable-gain IF amplifier 5 that amplifies the output signal from the SAW filter 4, power detector 6 that detects the power from the RF amplifier 1, LPF 7, adder 8, A/D converter 9, demodulation LSI 10, CPU 11 and memory 12.

According to the present invention, AGC that takes into consideration the power ratio of the desired signal and interference signal (undesired signal), or so-called D/U ratio, is possible, and thus it is possible to improve the performance over the prior methods. A method of performing control using a function of the input signals power to both the RF and IF stages without using the power of the interference signal (undesired signal) is possible. Moreover, in regards to calculating the power of the input signals to both stages, characteristics such as the gain or loss in circuits in the signal path such as the mixing unit 3 or SAW filter 4 could also be used.

Furthermore, since all AGC is performed from the demodulation LSI, AGC based on the SN ratio and/or data error rate observed in the demodulation LSI, or adaptive control of the AGC speed can be performed easily in the demodulation LSI.

Furthermore, it is possible to input the information of the total power for the RF stage to the demodulation LSI without having to greatly increase the hardware. This makes it possible to easily perform adaptive control of the RF/IF gain balance, as well as adaptive control of the RF gain control speed.

Furthermore, by minimizing the error rate of the data in this way, it is also possible to continuously adjust the gain. Moreover, it is also possible to perform demodulation of the data using the CPU.

Furthermore, it is possible to independently perform gain control of the RF amplifier from the demodulation LSI without having to greatly increase the hardware. This makes it possible to easily perform adaptive control of the RF/IF gain balance, as well as change the RF gain control speed and perform RF adaptive control.

The entire disclosure of Japanese Patent Application No. 2002-308410 filed on Oct. 23, 2002 including the specification, claims, drawings and summary is incorporated herein by reference in its entirety.

What is claimed is:

1. An automatic gain control system comprising:
    a radio-frequency amplifier;
    a local oscillator;
    a mixing unit that combines an output signal from said radio-frequency amplifier and an output signal from said local oscillator and generates an intermediate-frequency signal;
    a bandpass filter that limits a bandwidth of said intermediate-frequency signal;
    an intermediate-frequency amplifier that amplifies an output signal from said bandpass filter;
    a power detector that detects a power of the output signal from said radio-frequency amplifier;
    a filtering unit that filters an output signal from said power detector;

an adder that adds an output signal from said filtering unit and an output signal from said intermediate-frequency amplifier;

an A/D converter that converts an output signal from said adder from analog to digital; and a controller that adjusts a gain of said radio-frequency amplifier and a gain of said intermediate-frequency amplifier based on an output signal from said A/D converter.

2. The automatic gain control system according to claim 1, wherein said controller calculates both a power of the radio-frequency signal that is input to said radio-frequency amplifier and a power of the intermediate-frequency signal that is input to said intermediate-frequency amplifier, whose bandwidth is limited, based on the gain of said radio-frequency amplifier and the gain of said intermediate-frequency amplifier, and adjusts the gain of said radio-frequency amplifier and the gain of said intermediate-frequency amplifier based on the calculated powers.

3. The automatic gain control system according to claim 1, wherein said controller calculates an error rate for data outputted from the A/D converter, and adjusts the gain of said radio-frequency amplifier and the gain of said intermediate-frequency amplifier based on the calculated error rate.

* * * * *